US012765410B2

(12) United States Patent
Fukumoto

(10) Patent No.: US 12,765,410 B2
(45) Date of Patent: Oct. 13, 2026

(54) MOUNTING HEAD

(71) Applicant: Yamaha Robotics Co., Ltd., Tokyo (JP)

(72) Inventor: Shinsuke Fukumoto, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 575 days.

(21) Appl. No.: 18/269,949

(22) PCT Filed: Dec. 28, 2020

(86) PCT No.: PCT/JP2020/049184
§ 371 (c)(1),
(2) Date: Jun. 27, 2023

(87) PCT Pub. No.: WO2022/144997
PCT Pub. Date: Jul. 7, 2022

(65) Prior Publication Data

US 2024/0063170 A1 Feb. 22, 2024

(51) Int. Cl.
*H01R 31/00* (2006.01)
*H10W 72/00* (2026.01)

(52) U.S. Cl.
CPC .. *H10W 72/0711* (2026.01); *H10W 72/07141* (2026.01); *H10W 72/07152* (2026.01); *H10W 72/07188* (2026.01)

(58) Field of Classification Search
CPC ........... H10W 72/0711; H10W 72/071; H10W 72/07141; H10W 72/07152; H10W 72/07188
See application file for complete search history.

(56) References Cited

U.S. PATENT DOCUMENTS 4,926,903 A * 5/1990 Kawai .................. G05D 7/0635 137/554
6,739,036 B2 * 5/2004 Koike ................ H05K 13/0413 29/721

(Continued)

FOREIGN PATENT DOCUMENTS

JP H06268030 9/1994
JP H10275833 10/1998

(Continued)

OTHER PUBLICATIONS

"Office Action of Korea Counterpart Application", with English translation thereof, issued on Nov. 11, 2024, pp. 1-10.

(Continued)

*Primary Examiner* — Paul D Kim
(74) *Attorney, Agent, or Firm* — JCIPRNET

(57) ABSTRACT

A mounting head for bonding a chip to a bonding target includes: a mounting tool having a bottom surface which functions as a suction surface for sucking and holding the chip; a heater arranged on an upper surface of the mounting tool and heating the mounting tool; a cooling mechanism having a plurality of cooling channels which are independent of one another and guide a refrigerant respectively to a plurality of cooling areas set in the heater, and being capable of cooling the plurality of cooling areas independently of one another; and a controller controlling driving of the heater and the cooling mechanism. The controller independently controls a flow rate of the refrigerant flowing through the plurality of cooling channels so as to obtain a desired temperature distribution during heating of the heater.

10 Claims, 5 Drawing Sheets

(56) References Cited

U.S. PATENT DOCUMENTS

| | | | | |
|---|---|---|---|---|
| 9,368,377 | B2 | 6/2016 | Tandou et al. | |
| 9,398,736 | B2 * | 7/2016 | Nagai | H05K 13/0465 |
| 2014/0256090 | A1 | 9/2014 | Interrante et al. | |
| 2015/0129135 | A1 * | 5/2015 | Lee | H10W 72/0711 156/583.1 |
| 2023/0274951 | A1 * | 8/2023 | Noguchi | H10W 72/0711 438/107 |

FOREIGN PATENT DOCUMENTS

| | | |
|---|---|---|
| JP | 2000216140 | 8/2000 |
| JP | 2007329306 | 12/2007 |
| JP | 2008294146 | 12/2008 |
| JP | 2012199358 | 10/2012 |
| JP | 2016122726 | 7/2016 |
| JP | 2016149567 | 8/2016 |
| JP | 2020025141 | 2/2020 |
| KR | 20040080141 | 9/2004 |

OTHER PUBLICATIONS

"Office Action of China Counterpart Application", issued on Apr. 19, 2025, with English translation thereof, p. 1-p. 15.

"Office Action of China Counterpart Application", issued on Aug. 19, 2025, with English translation thereof, p. 1-p. 18.

"International Search Report (Form PCT/ISA/210) of PCT/JP2020/049184", mailed on Apr. 6, 2021, pp. 1-4.

"Office Action of Taiwan Counterpart Application", issued on Oct. 21, 2022, with English translation thereof, pp. 1-10.

"Written Opinion of Singapore Counterpart Application", issued on Nov. 18, 2025, pp. 1-9.

* cited by examiner

46

| | Heater | F a | F b |
|---|---|---|---|
| Distribution A | I1 | F1 | F1 |
| Distribution B | I1 | F2 | F1 |
| Distribution C | I2 | F3 | F4 |
| | | | |

FIG. 5

MOUNTING HEAD

CROSS-REFERENCE TO RELATED APPLICATION

This application is a 371 application of the International PCT application serial no. PCT/JP2020/049184, filed on Dec. 28, 2020. The entirety of the above-mentioned patent application is hereby incorporated by reference herein and made a part of this specification.

TECHNICAL FIELD

The present specification discloses a mounting head for bonding a chip to a substrate.

RELATED ART

Conventionally, methods for bonding a chip and a substrate or a chip and another chip are generally performed by bonding them using a bonding member such as a solder material or an Au bump. In these bonding methods, a bonding member made of conductive metal is formed on the bottom surface of a chip, and while the bonding member is attached to an electrode of a substrate or another chip which is the bonding target, the bonding member is melted and solidified to connect a wiring part. In order to perform such bonding, a mounting head pressurizes the bonding target while heating the held chip to melt the bonding member.

Therefore, the mounting head is provided with a heater having a desired performance in consideration of the size, etc. of the chip. Since the chip needs to be heated and cooled quickly, a heater having a small heat capacity and high thermal responsiveness, such as a ceramic heater, is generally used.

CITATION LIST

Patent Literature

[Patent Literature 1] Japanese Laid-Open No. 2012-199358

SUMMARY OF INVENTION

Technical Problem

In general, the chip is required to be heated as uniformly as possible. However, it is difficult to make the surface temperature of the heater such as a ceramic heater mounted on the mounting head completely uniform, and the temperature varies depending on the regions. As a result, there is a problem that the chip cannot be heated uniformly.

Further, depending on the types of the chips, it may be desired to change the heating temperature according to the regions in the chip. For example, for a chip having a protected portion that has a low heat resistant temperature, it is desired to keep the heating temperature low only for the protected portion and keep the heating temperature high for the other portions. However, in the case of a configuration in which one chip is heated by one heater, it is not possible to keep the heating temperature low only for a desired portion.

Therefore, it is conceivable to dispose a plurality of heaters. With such a configuration, the surface temperature of the chip can be partially controlled to obtain a desired temperature distribution. However, when a plurality of heaters are disposed, there is another problem. That is, the installation space increases as the lead wires or the like increase. In addition, as the number of heater circuits increases, the safety mechanism for preventing overheating also becomes complicated.

Here, Patent Literature 1 discloses a heating head that has a heater and a collet for holding a chip, and the heating head roughly and densely distributes the contact density between the collet and the chip. According to such a technique, a distribution is generated in the heat capacity transferred from the heating head to the chip. Therefore, by adjusting the distribution of the contact density, the distribution of the surface temperature of the chip can be adjusted.

However, in Patent Literature 1, the mechanical configuration of the collet is changed in order to obtain the desired temperature distribution. Therefore, it is necessary to mechanically change the collet every time the required temperature distribution changes, which is not so versatile.

Therefore, the present specification discloses a mounting head that can more easily heat a chip with a desired temperature distribution.

Solution to Problem

A mounting head disclosed in the present specification is configured to bond a chip to a bonding target. The mounting head includes: a mounting tool having a bottom surface which functions as a suction surface for sucking and holding the chip; a heater arranged on a surface of the mounting tool opposite to the suction surface and heating the mounting tool; a cooling mechanism having a plurality of cooling channels, which are independent of one another and guide a refrigerant respectively to a plurality of cooling areas set in the heater, and being capable of cooling the plurality of cooling areas independently of one another; and a controller controlling driving of the heater and the cooling mechanism. The controller independently controls a flow rate of the refrigerant flowing through the plurality of cooling channels so as to obtain a desired temperature distribution during heating of the heater.

In this case, the controller may store in advance condition data, which records a relationship among a temperature distribution, a driving condition of the heater, and the flow rate of the refrigerant flowing through the plurality of cooling channels, and control driving of the heater and the cooling mechanism based on the condition data.

Further, a channel cross-sectional area of the cooling channel may gradually increase as the cooling channel approaches the heater.

Further, the controller may cause the refrigerant to flow through the plurality of cooling channels in both a heating process of the chip and a cooling process of the chip performed after the heating process.

Effects of Invention

The mounting head disclosed in the present specification can adjust the temperature distribution of the heater with the refrigerant and therefore can more easily heat a chip with a desired temperature distribution.

BRIEF DESCRIPTION OF DRAWINGS

FIG. 5 is an image diagram of the condition data.

DESCRIPTION OF EMBODIMENTS

Figure 1:
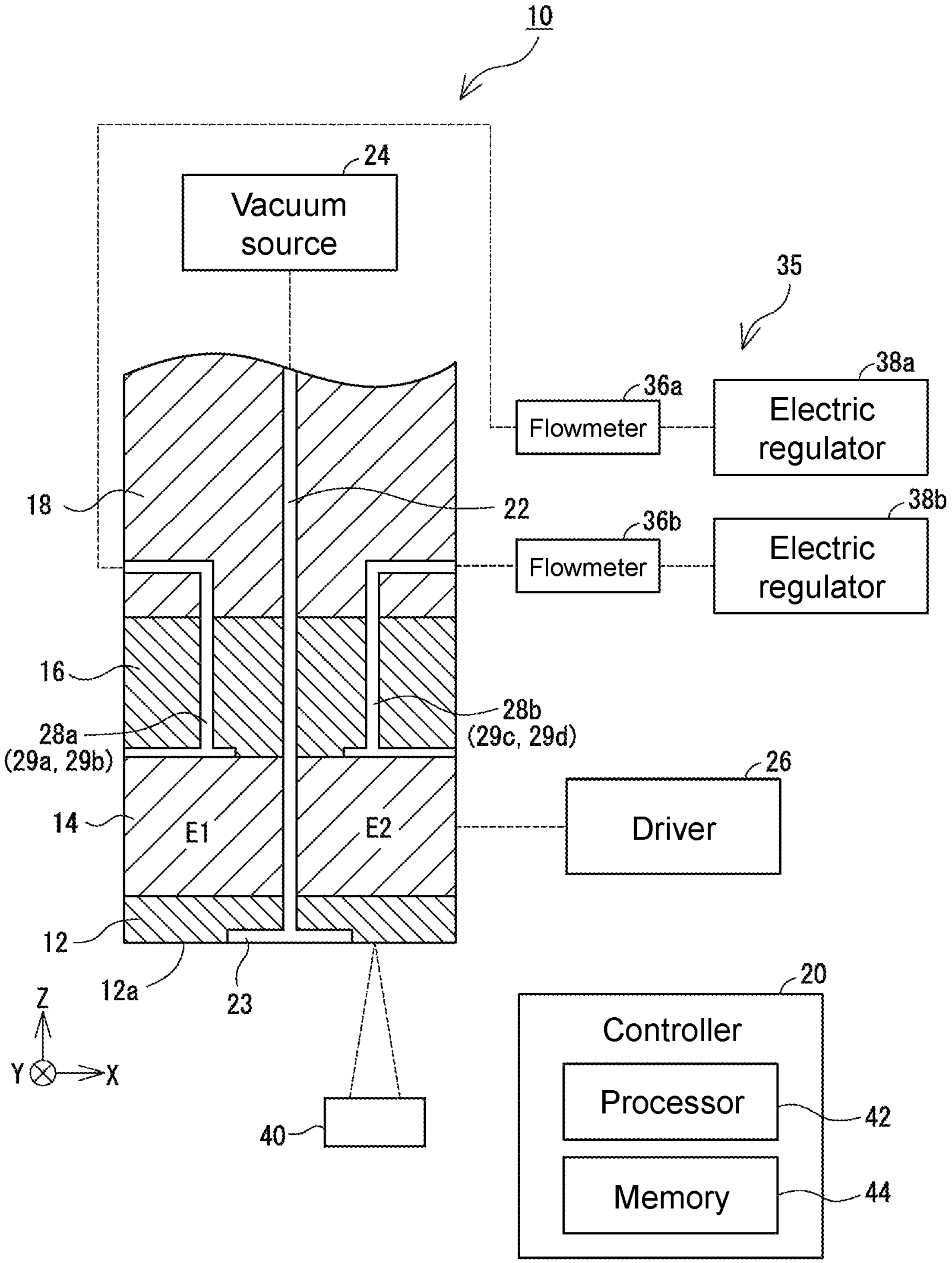
FIG. 1 is a block diagram showing a configuration of the mounting head.
Figure 2:
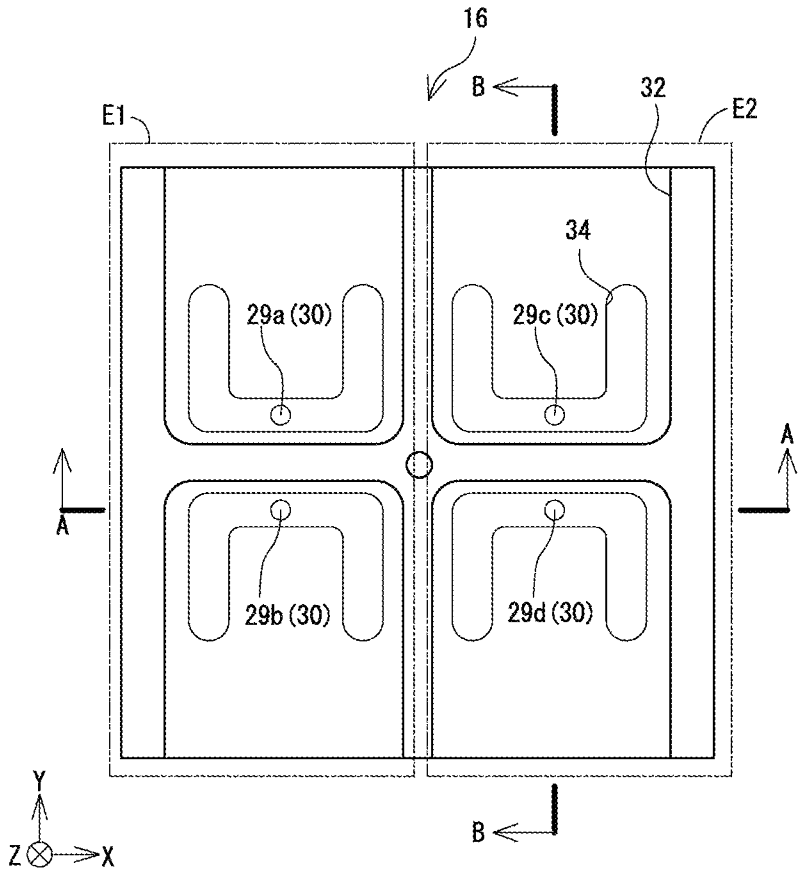
FIG. 2 is a bottom view of the holding block incorporated in the mounting head.
Figure 3A:
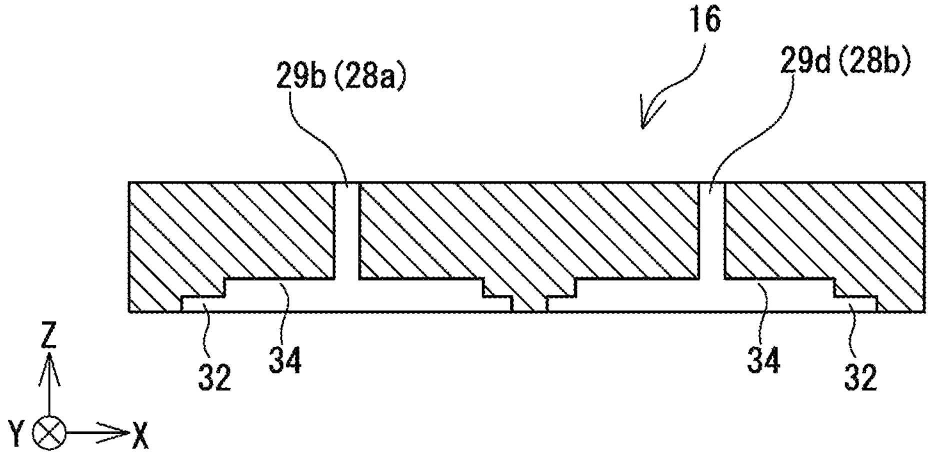
FIG. 3A is a cross-sectional view taken along the line A-A of FIG. 2.
Figure 3B:
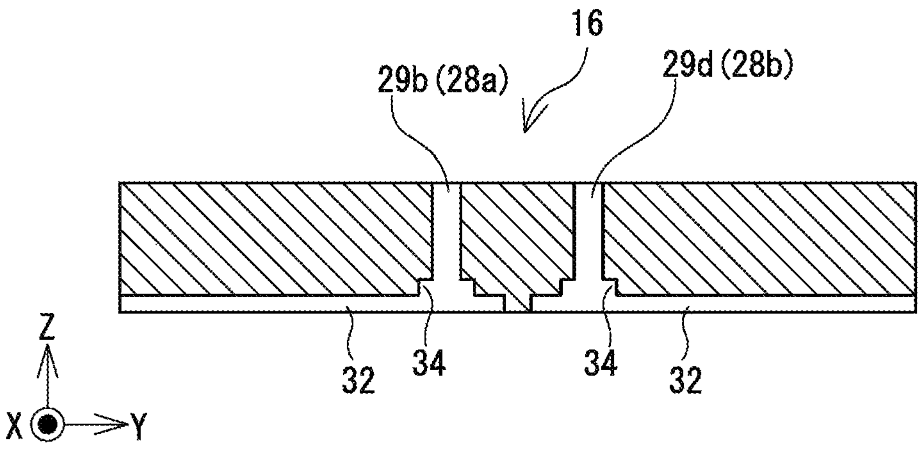
FIG. 3B is a cross-sectional view taken along the line B-B of FIG. 2.

Hereinafter, a configuration of a mounting head 10 will be described with reference to the drawings. FIG. 1 is a block diagram showing the configuration of the mounting head 10. Further, FIG. 2 is a bottom view of a holding block 16 incorporated in the mounting head 10. Further, FIG. 3A is a cross-sectional view taken along the line A-A of FIG. 2, and FIG. 3B is a cross-sectional view taken along the line B-B of FIG. 2. In the following, an axial direction of the mounting head 10 is referred to as "Z direction", a direction orthogonal to the Z direction is referred to as "X direction", and a direction orthogonal to both the Z direction and the X direction is referred to as "Y direction".

The mounting head 10 is used in a bonding process for bonding a chip (not shown) to a bonding target which is a substrate or another chip (not shown). A bump made of conductive metal is formed and projected on the bottom surface of the chip. The bump is a bonding member to be bonded to an electrode which is the bonding target. When bonding the chip to the bonding target, this bump is welded to the electrode to be bonded.

Specifically, the mounting head 10 moves relative to the bonding target in the horizontal direction and the vertical direction while sucking and holding the chip, and conveys the chip. The mounting head presses the bump of the chip against the electrode to be bonded and heats the chip to melt the bump. Then, after the bump is melted, the chip is cooled and the bump is solidified, so that the welding of the chip to the bonding target is completed.

As shown in FIG. 1, such a mounting head 10 is configured by stacking a mounting tool 12, a heater 14, the holding block 16, and a main body 18 in the axial direction. The bottom surface of the mounting tool 12 functions as a suction surface 12*a* for sucking and holding the chip. A suction recess 23 for sucking and holding the chip is formed on the suction surface 12*a* of the mounting tool 12. The suction recess 23 is connected to a vacuum source 24 via a suction hole 22. Then, the vacuum source 24 generates a suction force in the suction recess 23 as required.

The heater 14 is arranged on a surface of the mounting tool 12 opposite to the suction surface 12*a*, that is, on the upper surface of the mounting tool 12. The heater 14 heats the mounting tool 12, and thus the chip. The configuration of the heater 14 is not particularly limited. However, since the heater 14 quickly heats and cools the chip, it is desirable that the heater 14 has a small heat capacity and high thermal responsiveness. In this example, as the heater 14, a ceramic heater in which a heat generating resistor made of platinum, tungsten or the like is embedded inside ceramics such as aluminum nitride is adopted. The heater 14 is a square plate-shaped member. A driver 26 applies a current to the heater 14 as required to heat the heater 14.

The holding block 16 for holding the heater 14 is further provided on the upper surface of the heater 14. The holding block 16 is a block-shaped member interposed between the main body 18 of the mounting head 10 and the heater 14. The holding block 16 is made of a heat insulating material such as ceramics, and also functions as a heat insulating layer that inhibits heat transfer from the heater 14 to the main body 18.

The mounting head 10 is further provided with a cooling mechanism 35 for cooling the heater 14. The cooling mechanism 35 can cool a plurality of cooling areas E1 and E2 set in the heater 14 independently of one another. That is, in this example, the heater 14 is divided into two cooling areas, that is, a first cooling area E1 and a second cooling area E2, with the center line in the X direction as a boundary, and the two cooling areas E1 and E2 are cooled independently of each other. In the following, when the first cooling area E1 and the second cooling area E2 are not distinguished from each other, they are simply referred to as "cooling area E" with the suffixes 1 and 2 omitted. The same applies to other members.

In order to enable such cooling, the cooling mechanism 35 has two cooling channels 28*a* and 28*b*. The two cooling channels 28*a* and 28*b* are independent of each other, and the two cooling channels 28*a* and 28*b* do not communicate with each other. Each cooling channel 28 includes the holding block 16 and one or more cooling holes 29 formed in the main body 18. In this example, as shown in FIG. 2, FIG. 3A, and FIG. 3B, four cooling holes 29*a* to 29*d* are provided in one holding block 16. The four cooling holes 29*a* to 29*d* are arranged in two rows and two columns, two in the X direction and two in the Y direction. The two cooling holes 29*a* and 29*b* provided at positions facing the first cooling area E1 merge outside the holding block 16 and communicate with one electric regulator 38*a*. Both of the two cooling holes 29*a* and 29*b* function as the first cooling channel 28*a* for guiding a refrigerant to the first cooling area E1 of the heater 14. Further, the two cooling holes 29*c* and 29*d* provided at positions facing the second cooling area E2 also merge outside the holding block 16 and communicate with one electric regulator 38*b*. The two cooling holes 29*c* and 29*d* function as the second cooling channel 28*b* for guiding the refrigerant to the second cooling area E2 of the heater 14. The type of the refrigerant is not limited as long as the refrigerant can cool the heater 14. Therefore, for example, gas such as air may be used as the refrigerant. Furthermore, the refrigerant is not limited to gas, and liquids such as water and oil, and chlorofluorocarbon gas may be used as the refrigerant.

The four cooling holes 29 have the same configuration as one another. That is, the cooling hole 29 includes a main part 30, an end part 32 forming a planar channel in contact with the upper surface of the heater 14, and a middle part 34 interposed between the main part 30 and the end part 32. The main part 30 extends downward from the upper surface of the holding block 16. The middle part 34 is located near the lower end of the holding block 16. A channel cross-sectional area (that is, the horizontal cross-sectional area) of the middle part 34 is sufficiently larger than a channel cross-sectional area of the main part 30. In this example, the middle part 34 has a substantially U shape that opens outward in the Y direction in the bottom view.

The end part 32 is a recess formed in the bottom surface of the holding block 16 and functions as a planar channel extending along the upper surface of the heater 14. The Y-direction end portion of the end part 32 communicates with an external space so that the refrigerant can be discharged to the outside. The shape of the end part 32 is not particularly limited, but in this example, as shown in FIG. 2, the end part 32 has a substantially rectangular shape that completely covers the middle part 34 in the bottom view.

As is clear from FIG. 2, a channel cross-sectional area of the end part 32 is larger than the channel cross-sectional area of the middle part 34. In other words, in this example, the channel cross-sectional area of each cooling channel 28 gradually increases as the cooling channel 28 approaches the heater 14. With such a configuration, the refrigerant gradually spreads in the plane direction in the process of advancing from the main part 30 to the end part 32 via the middle part 34. As a result, the refrigerant is evenly dispersed in the vicinity of the upper surface of the heater 14, so that the heater 14 can be cooled more evenly.

The cooling mechanism 35 further includes the electric regulators 38 and a flowmeter 36. Similar to the cooling channels 28, a plurality of electric regulators 38 are provided, and the plurality of electric regulators 38 are driven independently of one another. In addition, each electric regulator 38 adjusts the flow rates Fa and Fb of the refrigerant flowing through the corresponding cooling channels 28. Therefore, the flow rate F of the refrigerant flowing through each cooling channel 28 can be controlled independently of one another. The flowmeter 36 is provided between the electric regulator 38 and the cooling channel 28, and measures the flow rate F of the refrigerant flowing through each cooling channel 28.

The controller 20 controls the driving of the vacuum source 24, the driver 26, and the electric regulator 38 described above. The controller 20 is physically a computer including a processor 42 and a memory 44.

At the timing when the chip is desired to be sucked and held, the controller 20 drives the vacuum source 24 to apply a suction force to the suction recess 23. Further, the controller 20 drives the driver 26 to raise the temperature of the heater 14 when the chip is heated, that is, at the timing when the bump of the chip is melted. Further, after the bump is melted, the controller 20 turns off the heater 14 at the timing when the bump is desired to be solidified, and drives the cooling mechanism 35 to send the refrigerant to the cooling channel 28 to air-cool the heater 14.

The surface temperature of the heater 14 usually varies slightly due to variation in the distribution of the built-in heat generating resistor. The variation is more likely to occur as the size of the chip to be handled increases. On the other hand, many chips are required to be heated evenly at the time of bonding. The accuracy requirement for uniform heat becomes stricter as the accuracy of the chip increases. Therefore, when the chips are heated by a single heater, it may be difficult to satisfy the required accuracy of uniform heat.

For some chips, it may be desired to actively bias the temperature distribution during heating. For example, some chips have a protected portion that partially has low heat resistance. It is desirable that such chips are heated with a temperature distribution that keeps the protected portion at a low temperature and keeps the other portions at a high temperature.

Therefore, in order to heat the chip with a desired temperature distribution, it is conceivable to dispose a plurality of heaters 14. In this case, by driving the plurality of heaters 14 that heat different areas of the chip independently of one another, the temperature distribution of the chip can be brought closer to the desired temperature distribution.

However, when the plurality of heaters 14 are disposed, the number of lead wires drawn from the heat generating resistors and temperature sensors (for example, thermoelectric pair) increases accordingly, which leads to an increase in the installation space. Further, when the plurality of heaters 14 are disposed, it is necessary to provide a plurality of safety circuits for preventing overheating, etc., which complicates the overall configuration.

Therefore, in this example, in order to obtain the desired temperature distribution without increasing the number of heaters 14, the plurality of cooling channels 28 independent of one another are provided, and the flow rate F of the refrigerant flowing through the plurality of cooling channels 28 is controlled independently of one another, thereby adjusting the temperature distribution of the heater 14. This will be described below.

Figure 4:
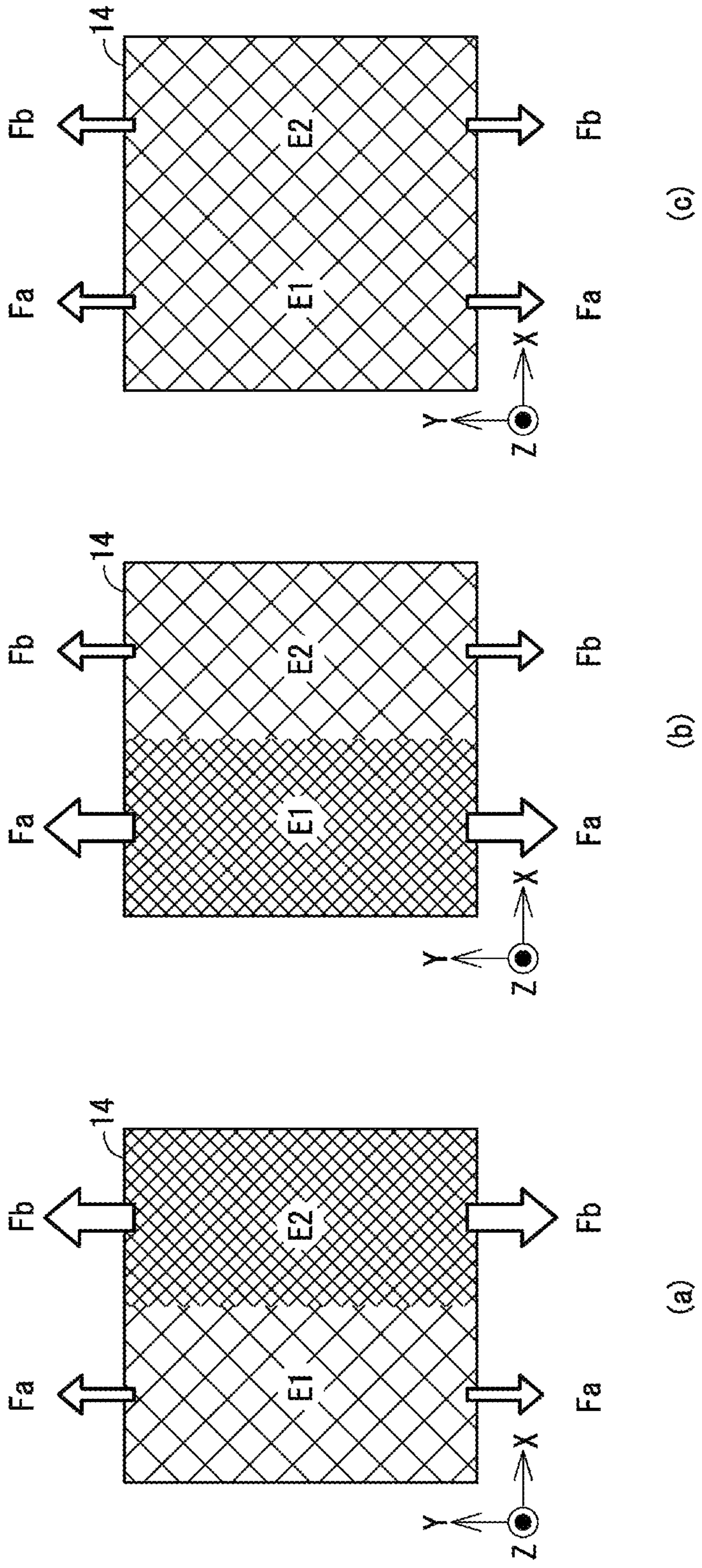
FIG. 4 is a diagram showing the states of temperature adjustment when it is desired to make the temperature distribution of the heater even.

FIG. 4 is a diagram showing the states of temperature adjustment when it is desired to make the temperature distribution of the heater 14 even. In FIG. 4, the cross-hatching shows the temperature distribution of the heater 14, and the finer the cross-hatching is, the higher the temperature is. Further, the arrows indicate the flow rate Fa of the refrigerant in the first cooling channel 28*a* and the flow rate Fb of the refrigerant in the second cooling channel 28*b*.

As shown in (a) of FIG. 4, it is assumed that the temperature of the second cooling area E2 tends to be higher than the temperature of the first cooling area E1 due to the characteristics of the heater 14 itself. In this case, in this example, in order to make the temperature of the heater 14 uniform, the cooling mechanism 35 is driven in parallel with the driving of the heater 14, and the refrigerant for cooling is supplied to the cooling channels 28*a* and 28*b*. At this time, the flow rates Fa and Fb of the two cooling channels 28*a* and 28*b* are independently controlled so that the flow rate Fb of the refrigerant flowing through the high-temperature second cooling area E2 is larger than the flow rate Fa of the refrigerant flowing through the first cooling area E1. As a result, the heat of the second cooling area E2 is more actively dissipated than the first cooling area E1, and the temperature of the second cooling area E2 is lowered. As a result, the temperature of the second cooling area E2 is brought close to the temperature of the first cooling area E1, and the temperature distribution of the heater 14 can be more even.

Similarly, as shown in (b) of FIG. 4, when the temperature of the first cooling area E1 tends to be higher than the temperature of the second cooling area E2, the flow rates Fa and Fb of the two cooling channels 28*a* and 28*b* are independently controlled so that the flow rate Fa of the refrigerant flowing through the high-temperature first cooling area E1 is larger than the flow rate Fb of the refrigerant flowing through the second cooling area E2. In this case, the flow rate Fb of the refrigerant may be zero. As a result, the temperature of the first cooling area E1 is brought close to the temperature of the second cooling area E2, and the temperature distribution of the heater 14 can be more even.

Further, as shown in (c) of FIG. 4, when the temperature of the first cooling area E1 is the same as the temperature of the second cooling area E2, the flow rates Fa and Fb of the refrigerant flowing through the two cooling channels 28*a* and 28*b* are set to be the same. In this case, the flow rates Fa and Fb may both be zero.

As described above, in this example, the temperature distribution of the heater 14 is adjusted by adjusting the flow rates Fa and Fb of the refrigerant flowing through the two cooling channels 28*a* and 28*b*. With such a configuration, a desired temperature distribution can be obtained without disposing a plurality of heaters 14. When the flow rates of the plurality of cooling channels 28 are controlled independently of one another, although an increase in the number of the lead wires and safety circuits drawn from the heat generating resistor can be suppressed, the number of parts such as the electric regulators 38 increases. Nevertheless, the increase in cost and space due to the increase in the number of parts related to cooling is smaller than the increase in cost and space due to the increase in the number of heaters 14. Therefore, according to this example, the chip can be heated with a desired temperature distribution while the increase in cost and space is suppressed.

Furthermore, the cooling channel 28 of this example is used not only for adjusting the temperature distribution of the heater 14, but also for cooling the chip after the bump is melted. In other words, according to this example, it is not necessary to separately provide a cooling channel for chip cooling so an increase in space can be further suppressed.

Here, the temperature distribution of the heater 14 is determined by a combination of driving conditions (for example, the value of a current I applied) of the heater 14 and the flow rates Fa and Fb of the refrigerant flowing through the two cooling channels 28*a* and 28*b*. The controller 20 acquires condition data 46, which records a relationship among the temperature distribution of the heater 14, the driving conditions of the heater 14, and the flow rates Fa and Fb of the refrigerant flowing through the two cooling channels 28*a* and 28*b*, prior to the bonding process. FIG. 5 is an image diagram of the condition data 46. At the time of the bonding process, the controller 20 determines the applied current I and the flow rates Fa and Fb when the chip is heated based on the condition data 46.

The condition data 46 is acquired by an experiment. In the experiment, first, the current I is applied to the heater 14 until the temperature of each of the cooling areas E1 and E2 becomes equal to or higher than a target temperature. The temperatures of the respective cooling areas E1 and E2 at this time are acquired by a temperature sensor 40 (the sensor in FIG. 1). The form of the temperature sensor 40 is not limited as long as the temperature sensor 40 can acquire the temperatures of a plurality of measurement points on the surface of the heater 14. Therefore, the temperature sensor 40 may be a radiation thermometer that measures the temperatures in a non-contact manner using infrared rays. In this case, the temperatures of the plurality of measurement points are acquired by scanning infrared rays. Further, the temperature sensor 40 may be a contact-type temperature sensor such as a thermistor that contacts the surface of the heater 14 to measure the temperature. In this case, a plurality of temperature sensors 40 may be disposed on the surface of the heater 14. Furthermore, if there is one or more measurement points for measuring the temperatures for each of the cooling areas E1 and E2, the number and position thereof are not limited.

The controller 20 compares the obtained temperatures of the plurality of measurement points with the target temperature at that measurement point. Then, when the temperature of the measurement point is higher than the target temperature, the flow rate F of the refrigerant in the cooling channel 28 for cooling the cooling area to which the measurement point belongs is gradually increased. Finally, the refrigerant flow rate F when the temperature of the measurement point reaches the target temperature, and the current I applied to the heater 14 are recorded in the condition data 46.

During the bonding process, the controller 20 refers to the condition data 46 and drives the heater 14 and the cooling mechanism 35 with the current I and the flow rates Fa and Fb corresponding to the target temperature distribution. By acquiring the condition data 46 in advance in this way, it is not necessary to measure the temperature of the target surface again at the time of bonding, and the time required for the bonding process can be shortened.

The configuration described so far is an example, and other configurations may be modified as long as they have a plurality of cooling channels 28 independent of one another, and the controller 20 controls the flow rates F of the refrigerant flowing through the plurality of cooling channels 28 independently of one another so as to obtain a desired temperature distribution during heating of the heater 14. For example, in the above description, the refrigerant flow rates Fa and Fb are controlled so that the temperature distribution of the heater 14 is even, but depending on the types of the chips or substrates, the refrigerant flow rates Fa and Fb may be controlled to actively generate a temperature bias.

Further, in the above example, two cooling channels 28 are provided, but more than two cooling channels 28 may be provided. For example, in the above example, the two cooling holes 29 form one cooling channel 28, but one cooling hole 29 may form one cooling channel 28. That is, one electric regulator 38 may be provided for one cooling hole 29, and four cooling channels 28 independent of one another may be provided as a whole. In addition, the division of the cooling areas can be changed as appropriate. For example, in the above example, the heater 14 is divided into the two cooling areas E1 and E2, but the heater 14 may be divided into a matrix such as 2×2 or 3×3. Furthermore, the heater 14 may be divided into a substantially rectangular cooling area located at the center thereof and a substantially square cooling area surrounding the periphery of the cooling area at the center.

What is claimed is:

1. A mounting head for bonding a chip to a bonding target, the mounting head comprising:

a mounting tool having a bottom surface which functions as a suction surface for sucking and holding the chip;

a heater arranged on a surface of the mounting tool opposite to the suction surface and heating the mounting tool;

a cooling mechanism having a plurality of cooling channels, which are independent of one another and guide a refrigerant respectively to a plurality of cooling areas set in the heater, and being capable of cooling the plurality of cooling areas independently of one another; and a controller controlling driving of the heater and the cooling mechanism, wherein the controller independently controls a flow rate of the refrigerant flowing through the plurality of cooling channels so as to obtain a desired temperature distribution during heating of the heater, and wherein the controller stores in advance condition data, which records a relationship among a temperature distribution, a driving condition of the heater, and the flow rate of the refrigerant flowing through the plurality of cooling channels, and controls the driving of the heater and the cooling mechanism based on the condition data.

2. The mounting head according to claim 1, wherein a channel cross-sectional area of each of the cooling channels gradually increases as the cooling channel approaches the heater.

3. The mounting head according to claim 1, wherein the controller causes the refrigerant to flow through the plurality of cooling channels in both a heating process of the chip and a cooling process of the chip performed after the heating process.

4. The mounting head according to claim 1, wherein the heater is a single ceramic heater in which a heat generating resistor is embedded inside ceramics having the same shape as the suction surface, and the controller independently controls the flow rate of the refrigerant flowing through the plurality of cooling channels so that the desired temperature distribution is uniform during heating of the heater.

5. The mounting head according to claim 1, wherein a channel cross-sectional area of each of the cooling channels gradually increases as the cooling channel approaches the heater.

6. The mounting head according to claim 1, wherein the controller causes the refrigerant to flow through the plurality of cooling channels in both a heating process of the chip and a cooling process of the chip performed after the heating process.

7. The mounting head according to claim 2, wherein the controller causes the refrigerant to flow through the plurality of cooling channels in both a heating process of the chip and a cooling process of the chip performed after the heating process.

8. The mounting head according to claim 1, wherein the heater is a single ceramic heater in which a heat generating resistor is embedded inside ceramics having the same shape as the suction surface, and the controller independently controls the flow rate of the refrigerant flowing through the plurality of cooling channels so that the desired temperature distribution is uniform during heating of the heater.

9. The mounting head according to claim 2, wherein the heater is a single ceramic heater in which a heat generating resistor is embedded inside ceramics having the same shape as the suction surface, and the controller independently controls the flow rate of the refrigerant flowing through the plurality of cooling channels so that the desired temperature distribution is uniform during heating of the heater.

10. The mounting head according to claim 3, wherein the heater is a single ceramic heater in which a heat generating resistor is embedded inside ceramics having the same shape as the suction surface, and the controller independently controls the flow rate of the refrigerant flowing through the plurality of cooling channels so that the desired temperature distribution is uniform during heating of the heater.

* * * * *